United States Patent
Elfadel et al.

(10) Patent No.: US 8,472,224 B2
(45) Date of Patent: Jun. 25, 2013

(54) ADJUSTABLE WRITE BINS FOR MULTI-LEVEL ANALOG MEMORIES

(75) Inventors: Ibrahim M. Elfadel, Cortlandt Manor, NY (US); Michele M. Franceschini, White Plains, NY (US); Luis A. Lastras-Montano, Cortlandt Manor, NY (US); Thomas Mittelholzer, Rueschlikon (CH); Mayank Sharma, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/355,833

(22) Filed: Jan. 23, 2012

(65) Prior Publication Data
US 2012/0127790 A1 May 24, 2012

Related U.S. Application Data

(62) Division of application No. 12/566,430, filed on Sep. 24, 2009, now Pat. No. 8,125,809.

(51) Int. Cl.
*G11C 27/00* (2006.01)
(52) U.S. Cl.
USPC ............ 365/46; 365/45; 365/148; 365/163; 365/189.16; 365/189.15; 365/230.06; 365/233.16

(58) Field of Classification Search
USPC ........... 365/45, 46, 148, 163, 189.16, 189.15, 365/230.06, 233.16
See application file for complete search history.

(56) References Cited

U.S. PATENT DOCUMENTS

| | | | |
|---|---|---|---|
| 6,324,621 B2 | 11/2001 | Singh et al. | |
| 6,856,573 B2 | 2/2005 | Allen et al. | |
| 7,143,240 B2 | 11/2006 | Hsu et al. | |
| 7,840,516 B2 * | 11/2010 | Chang et al. | 706/47 |
| 7,853,545 B2 * | 12/2010 | Chang et al. | 706/47 |
| 2006/0031802 A1 | 2/2006 | Alpert et al. | |
| 2006/0126400 A1 * | 6/2006 | Sekiguchi et al. | 365/189.01 |

* cited by examiner

*Primary Examiner* — Fernando Hidalgo
(74) *Attorney, Agent, or Firm* — Cantor Colburn LLP; Dwayne Nelson

(57) ABSTRACT

Selecting bins in a memory by receiving a target cost for performing writes at an analog memory that is capable of storing a range of values. Possible bins that may be created in the range of values and a cost associated with each possible bin are determined. Each possible bin includes one or more of the values. A group of bins are identified, the group of bins are among the possible bins with associated costs that are within a threshold of the target cost. A maximum number of bins are selected from the group of bins that have non-overlapping values. The selected bins are stored along with the values of the selected bins utilized to encode and decode contents of the analog memory.

13 Claims, 16 Drawing Sheets

ADJUSTABLE WRITE BINS FOR MULTI-LEVEL ANALOG MEMORIES

CROSS-REFERENCE TO RELATED APPLICATION

This application is a divisional of U.S. Pat. No. 8,125,809, filed Sep. 24, 2009, the disclosure of which is incorporated by reference herein in its entirety.

BACKGROUND

This invention relates generally to computer memory, and more specifically, to techniques for writing to multi-level analog computer memory.

Memory technologies, such as flash memory and phase change memory (PCM), can have relatively long programming times relative to their respective read times. Flash memory may modulate a charge stored within a gate of a metal-oxide-semiconductor (MOS) transistor to shift the transistor's threshold voltage higher or lower per memory cell. PCM may use the different electrical characteristics of crystalline and amorphous states of chalcogenide material to store different data states per memory cell. Storing multiple bits per memory cell can present additional challenges to ensure accuracy of the stored data. For example, the application of a programming signal two times to the same PCM cell or to two different PCM cells does not necessarily lead to the same resistance values in the two cases. As a further example, PCM cell resistance values can change after programming, usually increasing with time. The meaning of a read resistance value therefore may change with time. Using a basic write-and-verify approach to memory programming which includes a sequence of write and read operations as a feedback mechanism can reduce errors in the writing process.

The amount of uncertainty in the outcome of a programming signal may differ for different programming signals. For example, in a PCM having a logarithmic resistance scale, it is often the case that the distribution of the log resistance for the SET (near crystalline) state in PCM has a smaller standard deviation than the distribution of the log resistance of the RESET (near amorphous) state in PCM. Similarly, a programming signal that makes the PCM cell have a log resistance somewhere in between the log resistances of the SET and RESET values is sometimes associated with a log resistance distribution that has a bigger standard deviation than that associated with the SET or RESET log resistance distributions.

SUMMARY

An exemplary embodiment is a computer implemented method for selecting bins in a memory. The method includes: receiving at a computer a target cost for performing writes at an analog memory that is capable of storing a range of values; determining at the computer possible bins that may be created in the range of values and a cost associated with each possible bin, each possible bin including one or more of the values; identifying at the computer a group of bins in the possible bins with associated costs that are within a threshold of the target cost; selecting at the computer a maximum number of bins having non-overlapping values from the group of bins; and storing the selected bins, the values of the selected bins utilized to encode and decode contents of the analog memory.

A further exemplary embodiment is a computer implemented method for selecting bins in a memory. The method includes: receiving at a computer a target cost for performing writes at an analog memory that is capable of storing a range of values, the range of values ordered starting with a first value; selecting a first bin having a first boundary equal to the first value; selecting a second boundary for the first bin such that the second boundary includes a number of consecutive values starting with the first value and a cost for performing a write to the first bin is within a first threshold of the target cost; selecting subsequent bins having non-overlapping values until the cost for performing a write to a subsequent bin is not within a second threshold of the target cost and there are no more values left within the range of values; and storing the first bin and the subsequent bins as selected bins, the values of the stored bins utilized to encode and decode contents of the analog memory.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
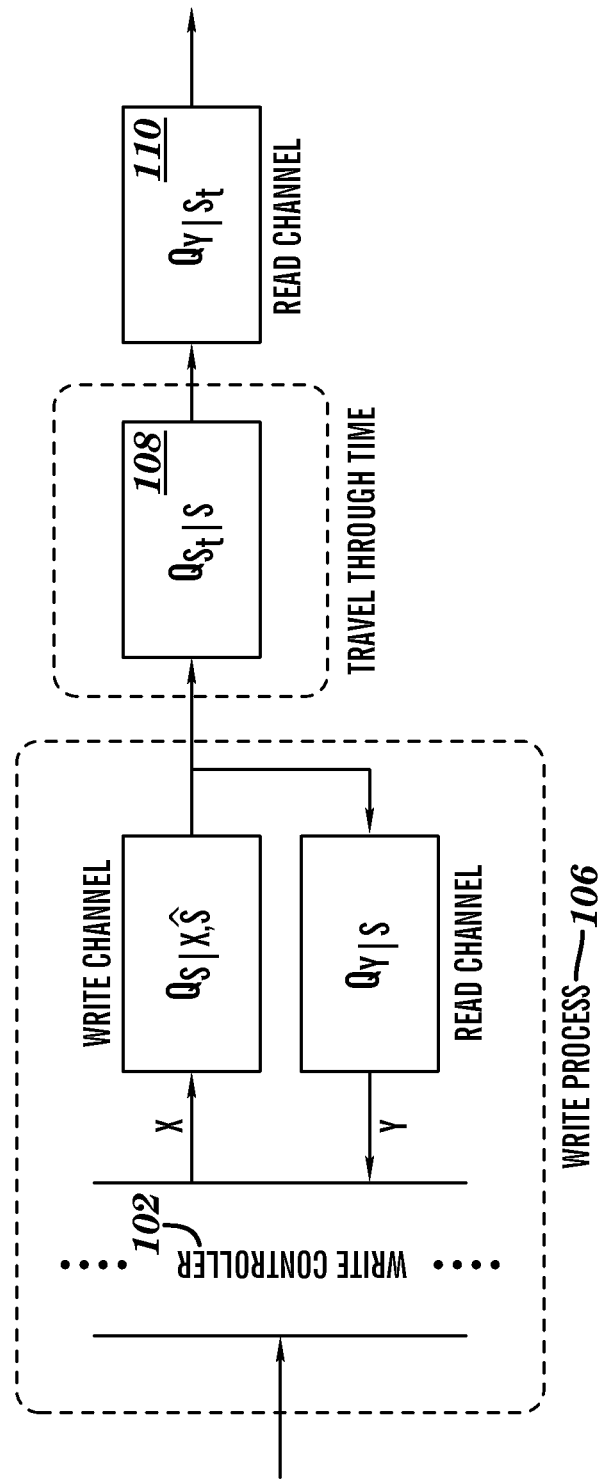
FIG. 1 illustrates an exemplary embodiment of a rewritable storage channel model.

An exemplary embodiment is directed to the design and implementation of write bins for analog memories. Each level in a multi-level analog memory is associated with a write bin, and in general, it may take multiple attempts at writing a level to a memory cell in order to reach an analog content inside of the desired bin. Typically, enlarging a bin size reduces the amount of time required to write into it, while reducing the bin size increases the amount of time required to write into it. The total cost for writing to a cell may be obtained by averaging the average number of times required to write to each of the levels in order to store a value in the required ranges (inside each of the bins). The particular kind of memories described herein are ones in which the accuracy of writing to a level might depend on the level itself, a phenomenon that may be termed data dependent noise. When data dependent noise arises, it is important to determine where to place the bins for each level and how wide the bins should be. Correct placement and bin length design results in an improved tradeoff between stored number of bits per cell and the associated cost for writing as described above.

An exemplary embodiment is directed to bins that are designed so that the average time to write to them is roughly equal across all bins. In many instances this results in an optimum channel storage capacity for a given allowance on average number of writes. Other exemplary embodiments are directed to bins that are designed so that an arbitrary cost assigned to each bin (not necessarily related to the average number of iterations required to write it) is equal across all bins. In one design described herein, an iterative approach is used to design the bins in order to get the maximum number of stored bits per cell at a given average cost to write per bin. In another design described herein, an optimization approach is utilized to design a specified number of bins such that the cost to write per bin is about the same across all of the bins.

Exemplary embodiments are directed to rewritable channels, that is, storage channels that admit optional reading and rewriting of the content at a given cost. This is a general class of channels that models many nonvolatile memories. The focus herein is on the storage capacity of rewritable channels affected by data dependent noise. Described herein is a proof of tight upper and lower bounds on the storage capacity of a simple yet significant channel model, along with some relatively simple capacity achieving coding techniques. Lower bounds on the storage capacity of Gaussian rewritable channels with data dependent noise are also described herein.

In a rewritable memory, the ability to read and possibly rewrite creates an opportunity that may be exploited in order to improve storage capacity, whenever the write mechanism is affected by some degree of uncertainty. This kind of feedback is different from the classical notion of feedback in the context of communication systems, due to the fact that overwritten data never reaches an external read request. Write-and-verify algorithms may be utilized by current memory technologies to improve the distribution of the stored values, thus allowing the storage of multiple bits per cell.

The concept of storage capacity of a rewritable channel may be characterized by a uniformly distributed additive write noise model. An upper and a lower bound on storage capacity may be obtained, considering a cost constraint, where cost is defined in an exemplary embodiment as the average number of write iterations. The lower and upper bound touch in a countable set of points and the bounds are asymptotically tight for increasing cost.

As described herein, an exemplary embodiment also accounts for possible dependency of the write noise on the programming stimulus. This dependence is a common phenomenon that has been observed in rewritable memories. Upper and lower bounds on the storage capacity as a function of the cost are obtained, defined in an exemplary embodiment as the average number of write attempts needed for programming a memory element. The lower bound is obtained by constructing a practical write strategy. The obtained bounds are then applied to a rewritable channel whose statistical characterization is motivated by measurements of real PCM devices. As described herein, write strategies based on these theoretical results lead to significant storage gains with respect to strategies designed for non data-dependent noise. In additional embodiments, the insights obtained for uniformly distributed additive noise are utilized to design a write strategy for a Gaussian rewritable channel with data dependent noise.

From an information theoretic point of view, the peculiarity of rewritable channels lays in the capability of reading back the stored content and possibly performing a rewrite. This simple possibility opens a large amount of degrees of freedom in the optimization of the methods for storing data on the rewritable medium. As described herein, a focus of exemplary embodiments is on determining the maximum number of bits that in average can be stored into a memory cell, or the storage capacity of the memory.

A general model for a rewritable memory is shown in FIG. 1. As depicted in FIG. 1, a write controller 102 accepts a message 104 to be stored into a memory. Based on the message 104, the write controller 102 selects a write policy, i.e., an algorithm that iteratively sends a write signal $X^i$ to the memory and retrieves a read signal $Y^i$, where i denotes the iteration index. The memory behavior during the write process 106 is characterized by an internal state S, which in the general case might be not known, and by the transition statistics $Q_{S|X,\hat{S}}$ and $Q_{Y|S}$, where $\hat{S}$ and S denote the internal state before and after the application of the signal X, respectively.

The possible retrieval of the stored message happens after an elapsed amount t of time, after the write process is completed. The behavior of the memory, for the read operation is characterized by $Q_{S_t|\hat{S}}$ 108 and $Q_{Y|S_t}$ 110. $Q_{S_t|\hat{S}}$ 108 is the statistical description of the evolution of the internal state after an elapsed time t. $Q_{Y|S_t}$ 110 is the statistical relation between the internal state and the read value.

In general, applying a write signal to a memory cell is an expensive operation, in terms of consumed time and/or in terms of required energy. Therefore, exemplary embodiments are directed to evaluating the storage capacity at a given cost, or cost-constrained storage capacity.

An exemplary embodiment of a simple storage channel model, which captures some important characteristics common to rewritable storage media assumes that:

$$Q_{S|X,\hat{S}}=Q_{S|X}$$

$$Q_{Y|S}=\delta_{Y-S}$$

$$Q_{S_t|S}=\delta_{S_t-S}$$

In other words, Y=S, i.e., the internal state does not depend on the previous state $\hat{S}$ and is obtained without uncertainty by reading the cell, the memory state does not change with elapsed time and each atomic write/read operation, or write attempt, can be equivalently represented by:

$$Y^i=X^i+W^i \quad (1)$$

where $X^i \in X=[0,1]$ and the noise $\{W^i\}$ is a sequence of independent and identically distributed (i.i.d.) random variables uniformly distributed over $[-a/2, a/2]$, where a is a parameter that determines the width of the noise.

Assuming that each write attempt has a cost equal to 1, the cost-constrained storage capacity $C(\kappa)$ can be shown to satisfy:

$$\log \left\lfloor \frac{1+a}{a}\kappa \right\rfloor \leq C(\kappa) \leq \log \frac{1+a}{a}\kappa$$

where in the above, the floor operation |_x_| denotes the largest integer not exceeding x, κ denotes the average number of write attempts and the bounds coincide for 1+a/aκ∈N.

Data dependent noise arises whenever the noise statistics are a function of the written signal, which is a common phenomenon in nonlinear systems. An interesting example of a rewritable storage channel, which is affected by data-dependent noise, is PCM cells. In PCM, the memory cell stores information as a resistance value. The application of different programming signals leads to different statistics for the stored resistance value. It is common practice in the field to represent the resistance in the logarithmic domain.

Figure 2:
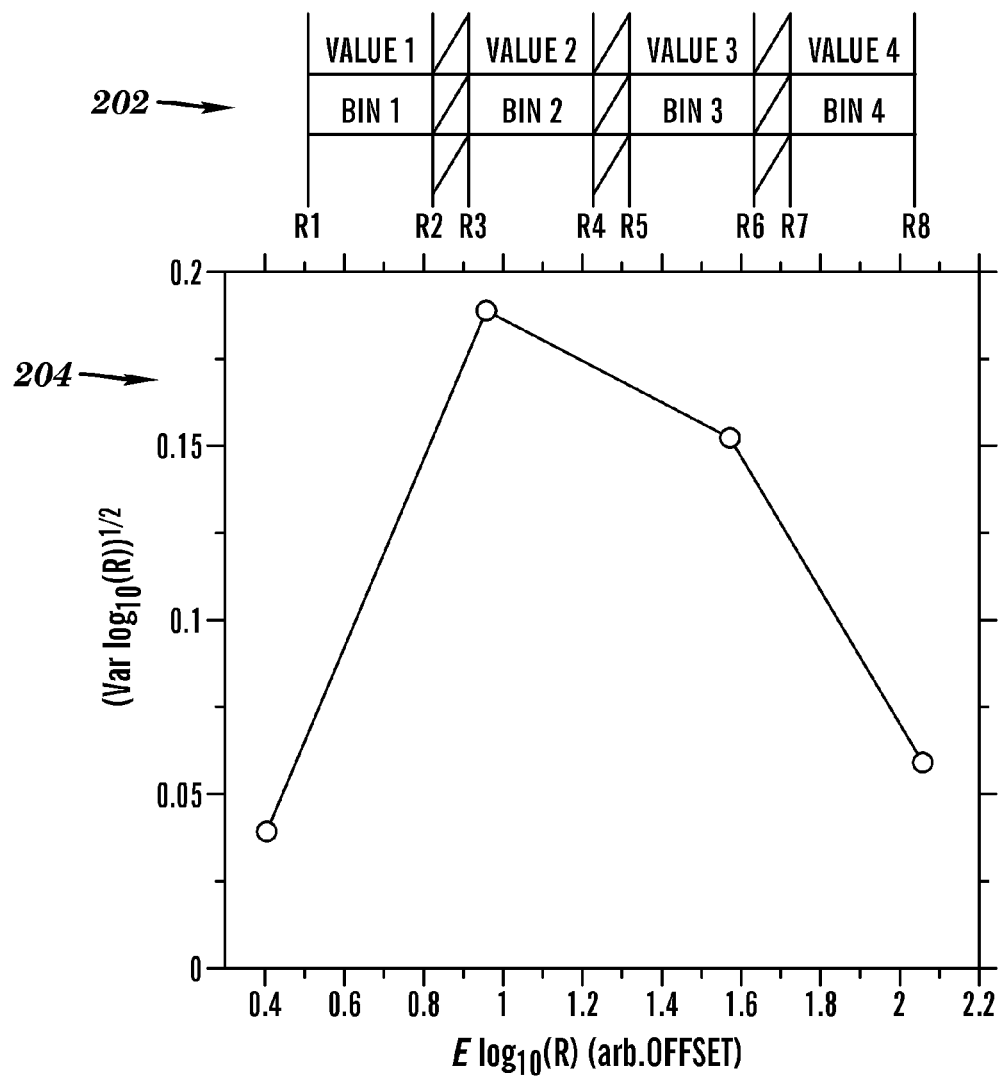
FIG. 2 illustrates a sample standard deviation of a resistance level stored in a phase change memory (PCM) cell and a sample bin layout.

FIG. 2 illustrates a chart 202 depicting a range of resistance values broken up into four bins. As depicted in FIG. 2, value one is represented in the memory location by a resistance value between R1 and R2, value two by a resistance value between R3 and R4, etc. Using the bins depicted in FIG. 2, four different values may be stored in each memory location. The chart 202 also includes guard bands between the bins (e.g., R2-R3 is the guard band between bin one and bin two. As described herein, the range covered by each bin may vary in size. For example, R1-R2 may represent one tenth of the available resistance values and R3-R4 may represent one fourth of the available resistance values. The available resistance values vary depending factors such as, but not limited to, the type of memory devices utilized and environmental factors.

FIG. 2 also illustrates a table 204 of a sample standard deviation of $\log_{10}(R)$ where R denotes the resistance stored into a PCM cell, shown as a function of the corresponding sample mean. The numbers in the table were obtained from estimates of sample experiments available in the literature and the table is included solely to illustrate the noise data dependency of the PCM medium. The average of $\log_{10}(R)$ can be controlled by changing the programming current. As shown in FIG. 2, the noise statistics are a nontrivial function of the average stored value, therefore the memory is intrinsically data dependent. In exemplary embodiments described herein it is assumed that memory cells are characterized by data dependent noise.

A simple extension of the channel model described by equation (1) is given by:

$$Y^i = X^i + a(X^i)W^i \quad (2)$$

where $\{W^i\}$ is a sequence of i.i.d. random variables uniformly distributed over $[-\frac{1}{2}, \frac{1}{2}]$ and $a(X^i)$, referred to herein as "noise width function", is the width of the additive noise when the signal X is written into the memory cell. The stored value $Y^i$ lies in the range:

$$Y = \left[ \min_{x \in [0,1]} x - \frac{a(x)}{2}, \max_{x \in [0,1]} x + \frac{a(x)}{2} \right].$$

Figure 3:
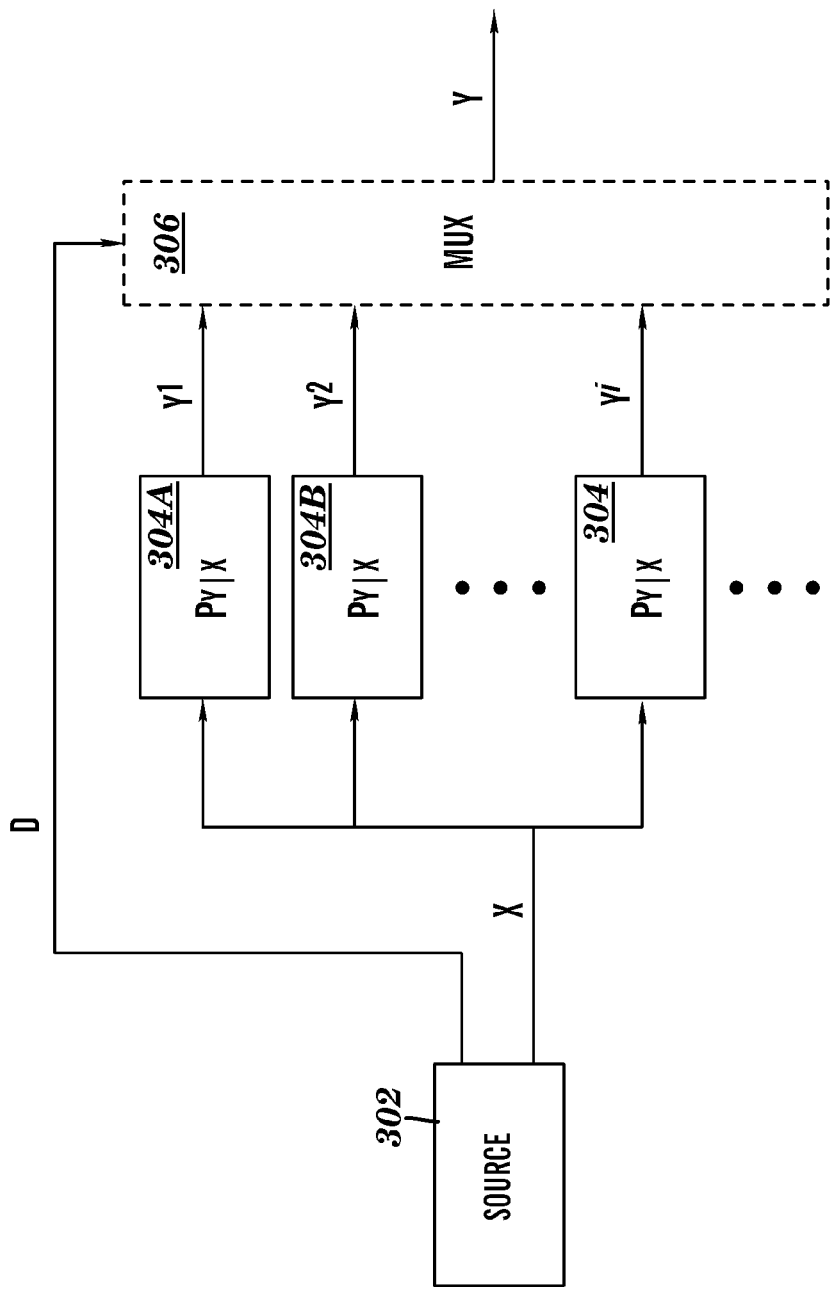
FIG. 3 illustrates a rewritable storage channel model that may be implemented by an exemplary embodiment.

This channel is employed using the simple write policy illustrated in FIG. 3, where at each iteration i the same input x∈X and the same target bin d∈D is used. Here D denotes the set of all half-open intervals contained in Y. The re-writing process stops at the first time instant L when $Y^L \in d$ and the corresponding channel output is $Y = Y^L$. The statistics of Y given the inputs x,d are given by $Q_{Y|X,D}(y|x,d)$. The maximum information rate I(X,D;Y) given the cost constraint E[L]≦κ is referred to herein as the cost-constrained capacity of this channel. The output of the i-th write attempt is denoted $Y^i$, and the final output of the write process is denoted by $Y \Delta Y^L$.

FIG. 3 depicts a more detailed model of the act of writing to a single memory location. The source 302 generates the location X to be signaled and the encoding interval D. The first attempt at writing is illustrated by the box 304a. If the result of writing to the memory location is within the desired interval, D, then the multiplexer (MUX) 306 accepts the result as the written value to memory and no more iterations take place. If on the other hand, the result of the box 304a is not within the desired interval D, a second attempt at writing is made, the result of which is obtained by the box 304b. As before, if the result is within the desired interval D, then the MUX 306 accepts the result as the written value to memory and no more iterations are done. If the result is not within the interval D, a third attempt is made, etc. The collective actions taken in here, that is, specifying a signal to be input to a memory location as well as the checking of the results of the signal and management of the iterative write loop are performed by the write control circuitry.

An exemplary embodiment writes to a memory using an iterative write process that is responsive to bin location and sizes that correspond to data values to be written to the memory. In an exemplary embodiment, a bin is an interval of resistances. By convention, the bin location is the leftmost border of the bin, and the bin size is the length of that interval. Note that there is a multiplicity of equivalent definitions for the bin location and this one is chosen simply for convenience. An embodiment for PCM programs a memory cell with a desired resistance range using an adjustable reset pulse for coarse precision followed by a one or more annealing pulses as a function of a read resistance value and a desired resistance range.

As used herein, the term "bin" refers to a desired resistance range that corresponds to a particular value being stored in the cell. Thus, a memory cell capable of storing four values will have four bins. In an exemplary embodiment, the bins are separated by guard bands to provide a space between each bin. As described previously, one measure of cost is the number of iterations required to write a given value to a memory cell. It is often the case that given bins of the same size, it requires a different number of iterations to write one value than it takes to write another value. Typically, it takes more iterations to write a value associated with a middle range resistance value than it takes to write a value associated with a high or low range resistance value. This variability can lead to unpredictable write times or the requirement to pace all writing according to the bin requiring the highest number of iterations. Exemplary embodiments described herein allow the use of variable sized bins (i.e., they cover different size resistance ranges) in order to even out (e.g., make substantially the same) the average number of iterations associated with each bin.

Exemplary embodiments include a method and apparatus for writing to a memory that supports possible rewriting. A signal to be written into a memory location is selected based on the bin locations and input data specifying desired memory location content.

Exemplary embodiments are applicable to memories in which rewriting is feasible and in which the act of writing may be impaired with uncertain outcomes. Examples of these type of memories include PCM and flash. In PCM, when the information is read through electrical means, information is stored in the resistance value of discrete cells that are arranged in an array of cells. PCM cells have the capability of holding a range of resistance values, which makes multi-bit storage on individual cells feasible. In PCM, a desired resistance in a cell is targeted by passing current through the cell; this has the effect of heating the cell. Depending on the form of an electrical write signal, the final resistance of the PCM cell can be controlled to a certain degree. Applying the same write signal to two different cells may result in distinct resistances. Even applying the same write signal two times to the same cell may result in distinct resistances.

Exemplary embodiments are applicable to both memories in which storage is accomplished using discrete entities, referred to herein as cells, as well as memories in which storage is performed on a medium that can be regarded as a continuous medium. The iterative write process is described in relation to a memory location or group of locations, where a location may be a discrete cell or the coordinates of a physical portion of a continuous medium. Examples of memory devices (the terms "memory devices", "memories" and "chip" are used interchangeably herein) with discrete cells include PCM organized in electrically readable arrays, where individual cells are targeted using row and column addressing. Examples of memories where the storage medium is continuous include digital video discs (DVDs), compact discs (CDs), probe based storage, magnetic hard drives, etc.

For the purposes of explanation about the write process, in exemplary embodiments, the act of writing and the act of reading the contents of a memory location are coalesced into a single operation. The input is a write signal that is applied to a memory location and the output is obtained by reading the memory location using a read mechanism available for the memory.

Bin location definitions may be unique to specific memory locations and some of them may be shared by multiple memory locations. Bin location definitions that are shared by multiple memory locations may be stored in a manner that they can be retrieved when writing to and possibly reading from the memory. It will often be advantageous to share bin location definitions by a sufficiently large number of memory locations, as their storage cost then becomes spread over the number of memory locations. Examples of groups of memory locations that can share bin location definitions include all memory locations in a chip, all memory locations in an array or sub-array within a chip, all memory locations within the same row of an array within a chip, or all memory locations within the same column of an array within a chip. The shared bin location definitions may be stored inside of the memory chip to which the parameters pertain, or may be stored outside in memories accessible by a memory controller reading and writing to the memory chip.

At the time of starting a write process, each write signal is associated with an expected content for the memory location. This association is established by combining any prior information that is available for the behavior of the memory locations. For example, it might be known that when a fixed current pulse is applied, an ensemble of PCM cells is associated with a distribution of resulting resistance values. The current pulse is then associated with the mean value of the distribution of resulting resistance values when it is applied to any element of the particular group of cells from which the distribution was derived. A different group of cells may have a different distribution of responses.

An appropriate sequence of inputs to the memory location is selected so that a final output is obtained that is within a desired output, or bin location. For example, a memory location may be programmed to hold one out of N values and during a write it is desired to ensure that the value of a memory location is sufficiently close to the desired value (i.e., within the corresponding bin location). In order to accomplish this, an iterative write procedure is utilized. In the iterative write procedure, a sequence of input signals $X_1, X_2, \ldots$ are written into the memory location resulting in outputs $Y^1, Y^2, \ldots$ respectively. The iterations stop at iteration L whenever it is detected that $|Y^L - v| < \epsilon$, where v denotes a desired value for the memory and $\epsilon$ is a desired accuracy parameter, where $(v-\epsilon, v+\epsilon)$ is the desired resistance range (or bin location).

A system taking advantage of exemplary embodiments described herein includes a memory subsystem. The memory subsystem includes one or more memory devices and a number of memory locations that may be accessed for reading their contents or for writing new contents. The memory locations may be accessed individually or in groups. For ease of description, the exemplary embodiments described below are directed to a single memory location being accessed. Other exemplary embodiments, as described herein, are directed to multiple memory locations being accessed as a group.

Figure 4:
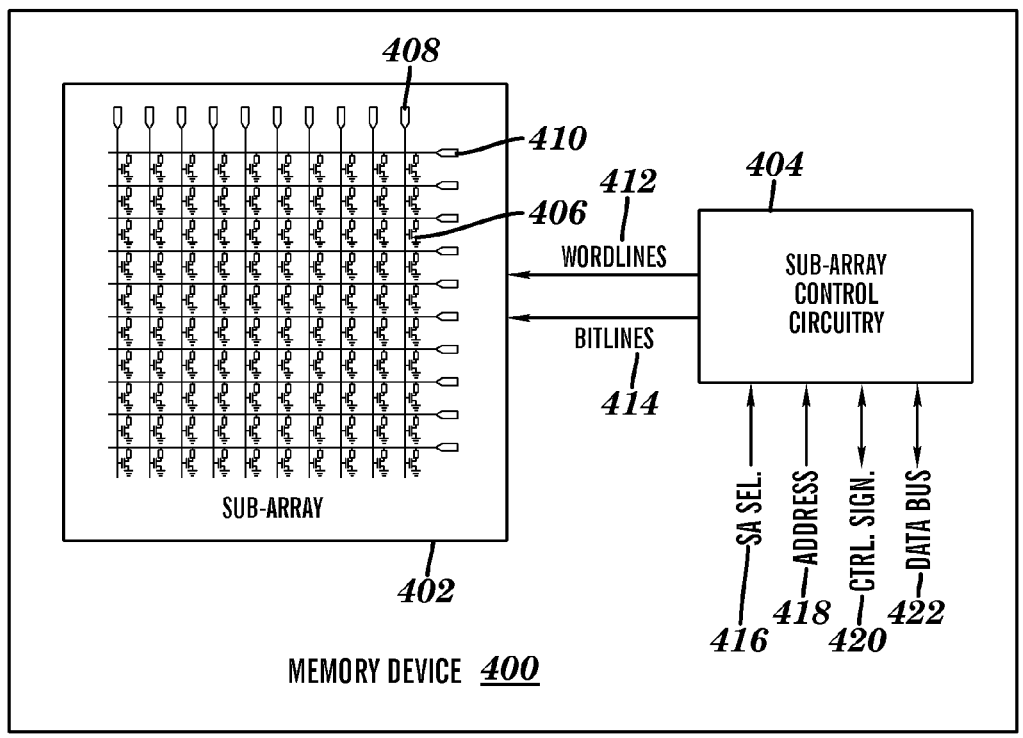
FIG. 4 illustrates an exemplary embodiment of a memory device.

Turning now to FIG. 4, an exemplary memory device 400 is depicted that includes a sub-array 402 controlled by sub-array control circuitry 404. While only one sub-array 402 is depicted in FIG. 4, it will be understood that multiple sub-arrays 402 and sub-array control circuitry 404 can be included in the memory device 400. The sub-array 402 includes a grid of multiple PCM cells 406 that are accessed using a combination of wordlines 408 and bitlines 410. The wordlines 408 and bitlines 410 are selected by wordline control signals 412 and bitline control signals 414 respectively, which not only select specific PCM cells 406 but may also read and write values to the PCM cells 406. The sub-array control circuitry 404 receives multiple inputs to control the wordline and bitline control signals 412 and 414. In an exemplary embodiment, the sub-array control circuitry 404 receives a sub-array select 416 and an address 418. The sub-array control circuitry 404 also can receive and drive control signals 420 and values on data bus 422.

Figure 5:
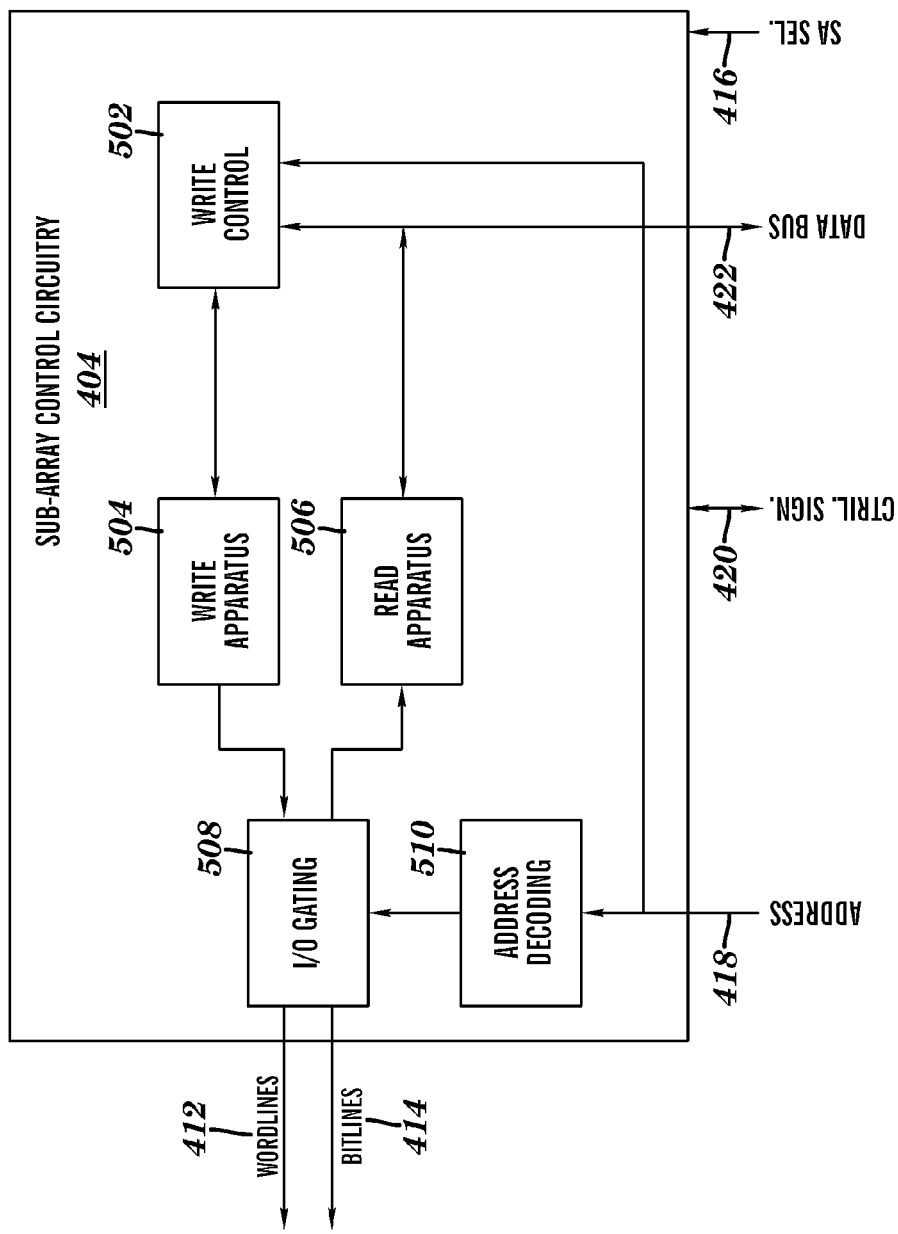
FIG. 5 illustrates an exemplary embodiment of sub-array control circuitry.

FIG. 5 depicts an exemplary embodiment of the sub-array control circuitry 404 of FIG. 4 in greater detail. The sub-array control circuitry 404 includes write control circuitry 502, a write apparatus 504, a read apparatus 506, I/O gating 508, and address decoding 510. The write control circuitry 502 may receive an address 418 to select one or more memory locations in the sub-array 402 of FIG. 4 for writing data specified on the data bus 422. The write control circuitry 502 is connected to the write apparatus 504. The write apparatus 504 includes a circuit responsible for interpreting write control signals and a circuit which, based on the write control signal, generates a corresponding write signal that is applied to the selected memory location via the I/O gating 508 to an address decoded by the address decoding 510. The I/O gating 508 can include signal buffering logic, level, and format conversion compatible with the sub-array 402 of FIG. 4. After the write signal is applied to the memory location, the read apparatus 506 accesses the same memory location and reads its contents via the I/O gating 508. The read apparatus 506 may receive the contents as a current and convert the current value to a resistance value and digitize the resistance value for use by the write control circuitry 502 (e.g., using an A/D converter). In similar fashion, the write apparatus 504 may receive commands to drive an adjustable reset pulse or an annealing pulse as a digital value, which is converted to an analog pulse of electrical current. The resulting value of the read is sent to the write control circuitry 502, which may use the read value to adjust the bin locations (as part of executing bin design logic) and to decide whether to stop the write process or to proceed with the application of another write signal or pulse.

Figure 6:
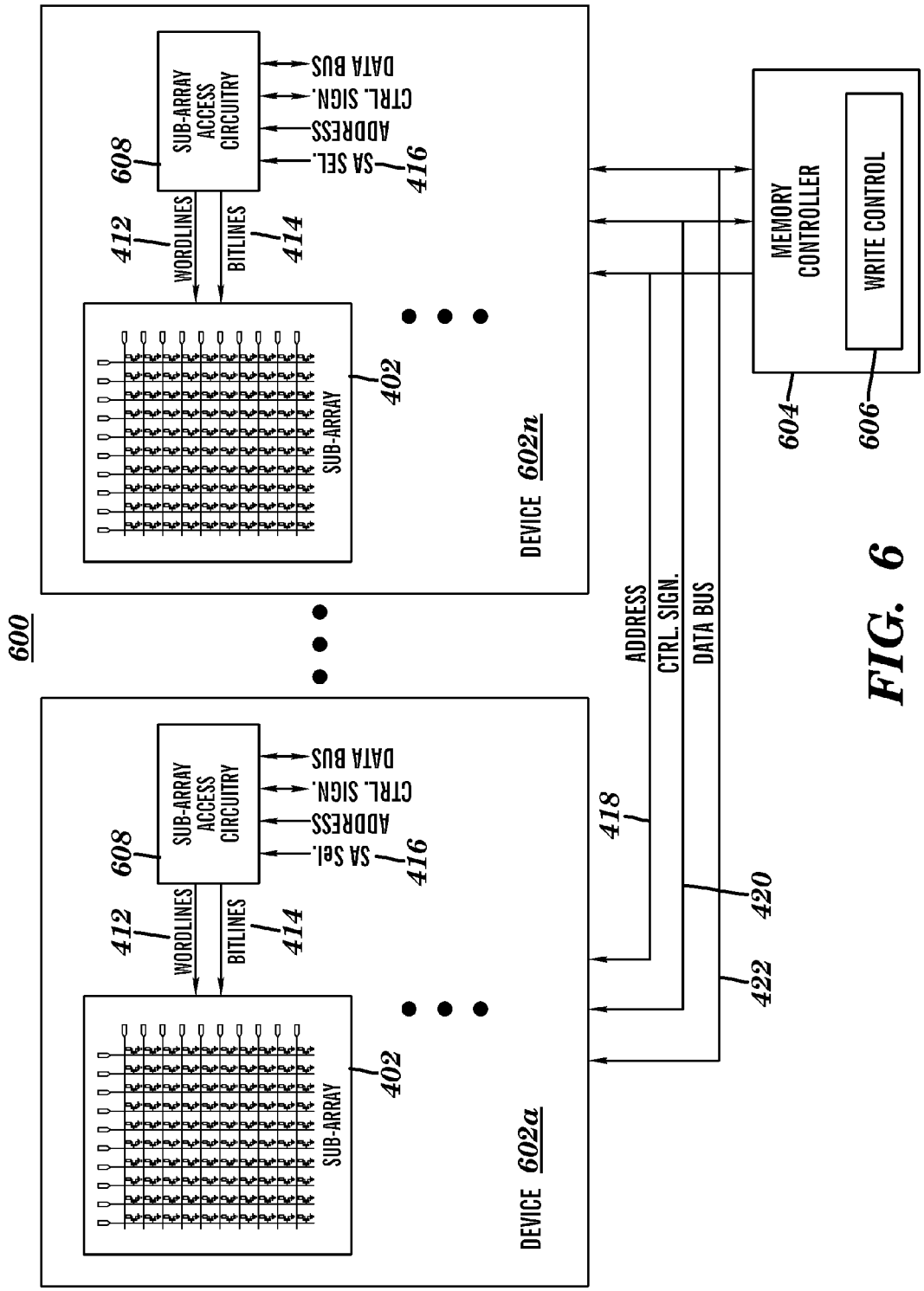
FIG. 6 illustrates an exemplary embodiment of a memory system with multiple memory devices.

FIG. 6 depicts an exemplary embodiment of a memory system 600 with multiple memory devices 602a-602n. In this embodiment, a memory controller 604 coordinates read and write activities to the memory devices 602a-602n using address 418, control signals 420, and data bus 422, which are communicated to the memory devices 602a-602n. The memory controller 604 includes a version of the write control circuitry 502 of FIG. 5, depicted as write control circuitry 606. The write control circuitry 606 performs substantially the same functions as the write control circuitry 502 of FIG. 5 but at the memory system level rather than individually distributing the logic within each of the memory devices 602a-602n. Sub-array access circuitry 608 receives the address 418, control signals 420, and data bus 422 driven by the write control circuitry 606, in addition to sub-array select 516 to select particular sub-arrays 502 within the memory devices 602a-602n.

Figure 7:
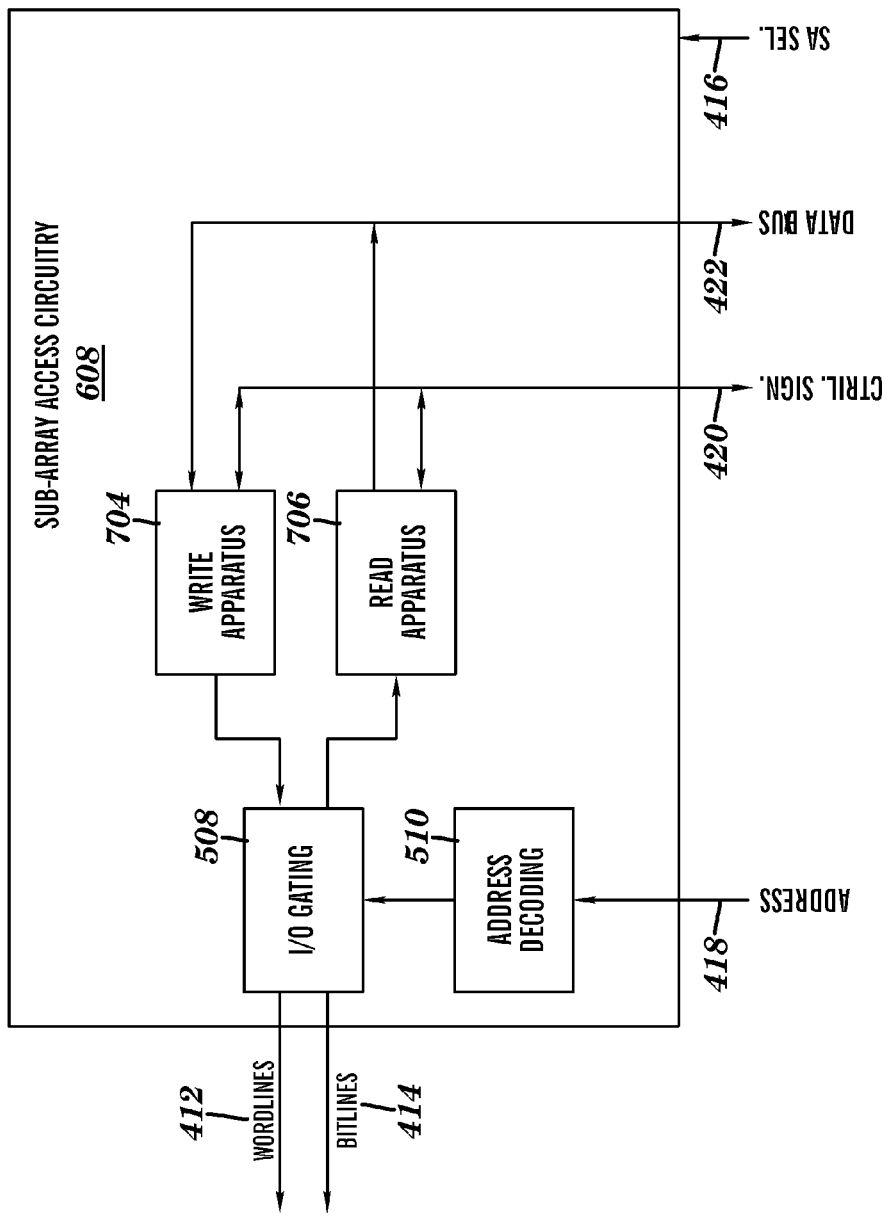
FIG. 7 illustrates an exemplary embodiment of sub-array access circuitry.
Figure 8:
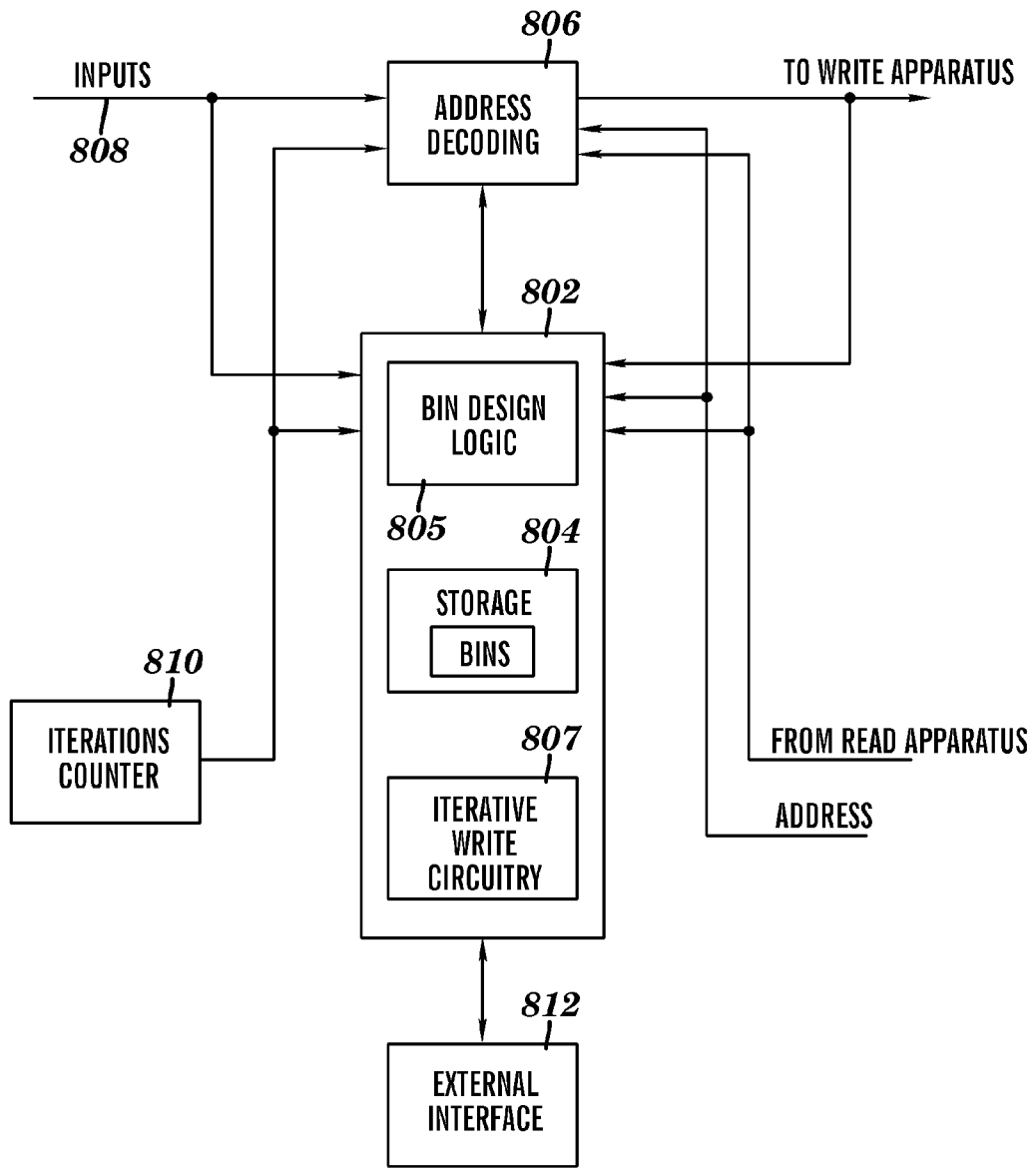
FIG. 8 illustrates an exemplary embodiment of write control circuitry.

FIG. 7 illustrates an exemplary embodiment of the sub-array access circuitry 608 of FIG. 6. In an exemplary embodiment, the sub-array access circuitry 608 includes a write apparatus 704 and a read apparatus 706. The write apparatus 704 is similar to the write apparatus 504 of FIG. 5; however, each may interface with different signals to produce the same output to the I/O gating 508. The write apparatus 704 may interface with the control signals 420 and the data bus 422 rather than directly interfacing to write control circuitry. The read apparatus 706 is also similar to the read apparatus 506 of FIG. 5, interfacing with the data bus 422 and the I/O gating 508. In alternate embodiments, the write apparatus 504 and read apparatus 506 of FIG. 5 are the same as the write apparatus 704 and read apparatus 706. The primary difference between the sub-array control circuitry 404 of FIGS. 4 and 5 as compared to the sub-array access circuitry 608 of FIGS. 6 and 7 is the inclusion or exclusion of write control circuitry, which in this example resides within the memory controller 604 and is depicted by the write control 606 box FIG. 8 illustrates an exemplary embodiment of write control circuitry 800. The write control circuitry 800 may be implemented in the write control circuitry 504 of FIG. 5 and/or in the write control circuitry 606 of FIG. 6. The write control circuitry 800 includes a write signal selector 806 for selecting a signal based on the content to be written that is received from inputs 808, on the location and size of the bin corresponding to the content to be written, and the input from the last read operation, if it is not the first write attempt. In an exemplary embodiment, the specified content to be written is a desired resistance range that corresponds to one of the bins. In an exemplary embodiment, the inputs 808 are from the data bus 422.

FIG. 8 also includes a control block 802 that includes bin design logic 805 (which is responsible for "designing" the bins), iterative write circuitry 807 (includes circuitry for deciding whether to stop the iterative write) and storage 808 (stores the bin locations as wells as information that helps the bin design logic 805 do its job, for example, the cost performance of some bins that are currently being used). In an exemplary embodiment, the storage 804 is implemented by any mechanism known in the art for storing data, including, but not limited to registers, main memory, and memory devices. In addition, FIG. 8 also depicts an external interface 812 which may be utilized to receive externally specified bins or to send the current bins outside for storage. The write control circuitry 800 also includes an iterations counter 810 for determining bin locations and sizes that are stored in storage 804. It is noted that the iterations counter 810 may also be used for alternate purposes such as determining whether a maximum number of iterations has been reached.

The storage 804 can store multiple collections of bin sizes and locations, each collection intended to be applied to particular addresses of the memory. In one exemplary embodiment, there is only a single address range and thus only one collection of bins and sizes are used. In another exemplary embodiment, there are two address ranges, each with different memory bit/cell densities. In one of the address ranges, one collection of bin locations and sizes are used. In another one of the address ranges, another collection of bin locations and sizes are used. Responsive to the address currently being written to, the iterative write circuit 807 selects from the storage 804 the appropriate collection of bin locations and sizes, and from that collection, the intended bin for writing. It then decides whether the value stored currently in memory belongs to the bin or not.

The bin design logic 805 determines the bin locations and sizes that are stored in the storage 804, and may be executed during system test, during system start-up, and/or during normal system operation. The bin design logic 805 uses parameters such as the desired number of bins/cell (which translates to a given number of bits/cell), and alternatively a desired average cost. Another parameter that may be passed to the bin design logic 805 is the desired guard band between bins, either as an absolute value or as a multiplier times the average of the sizes of the two nearby bins. The bin locations and sizes stored in the storage 804 are utilized by the stop criteria of the iterative write circuit 807 to decide whether a content read from the memory satisfies the desired conditions for stopping the iterative write circuit.

The bin locations stored in storage 804 are also used by a read apparatus, such as read apparatus 506, for decoding resistance values read from the memory; this as well is made responsive to the address currently being read; in other words, the appropriate collection of bin locations and sizes is retrieved from the storage 804 given the address being read. In an exemplary embodiment, the bin design logic 805 is executed at system start-up and then periodically during normal system operation. The bin design logic 805 may be executed at selected time intervals and/or it may be executed in response to detecting that the average number of iterations to write to each bin are no longer within a selected range of each other. It may also be executed in response to a request for changing the number of bits/cell in a region of memory to a different number of bits/cell. In the exemplary embodiments where the bin design logic 805 is executed during normal system operation (i.e., the bins are dynamically adjusted during run-time), the bin size and location at the time a memory location is written must be stored for use during a memory read to the memory location. In an exemplary embodiment, the iterations counter 810 is utilized, among other things, to count the number of iterations which is used as input to detecting that the average number of iterations to write to each bin are no longer within a selected range of each other. In an alternate exemplary embodiment, the bin design logic 805 is located external to the write control circuitry 800. In an alternate exemplary embodiment, the bin design logic 805 is implemented by means of a microprocessor or microcontroller executing instructions that may be stored in a variety of media, including SRAM, NOR and NAND FLASH, PCM, MRAM.

As used herein, the term "normal system operation" refers to the state of a machine when it is performing its intended function without any major impairment in function. For example, a database server that is serving requests at an acceptable response time and reliability is under normal system operation. On the other hand, a computer system with limited function because it is being repaired for faulty components is not under normal system operation. As used herein, the term "system start-up" refers to processing that is executed on a memory device each time that the memory device is powered-on (i.e., at system start-up) or in response to an initialization command. As used herein, the term "system test" refers to either a test that is executed on an assembled computer system together with its memory components prior to being used in its intended application, a test that is done on a memory part such as a memory DIMM (dual in-line memory module) prior to its usage in a system, or a test that is executed on a memory device prior shipping the memory device to a customer.

Figure 9:
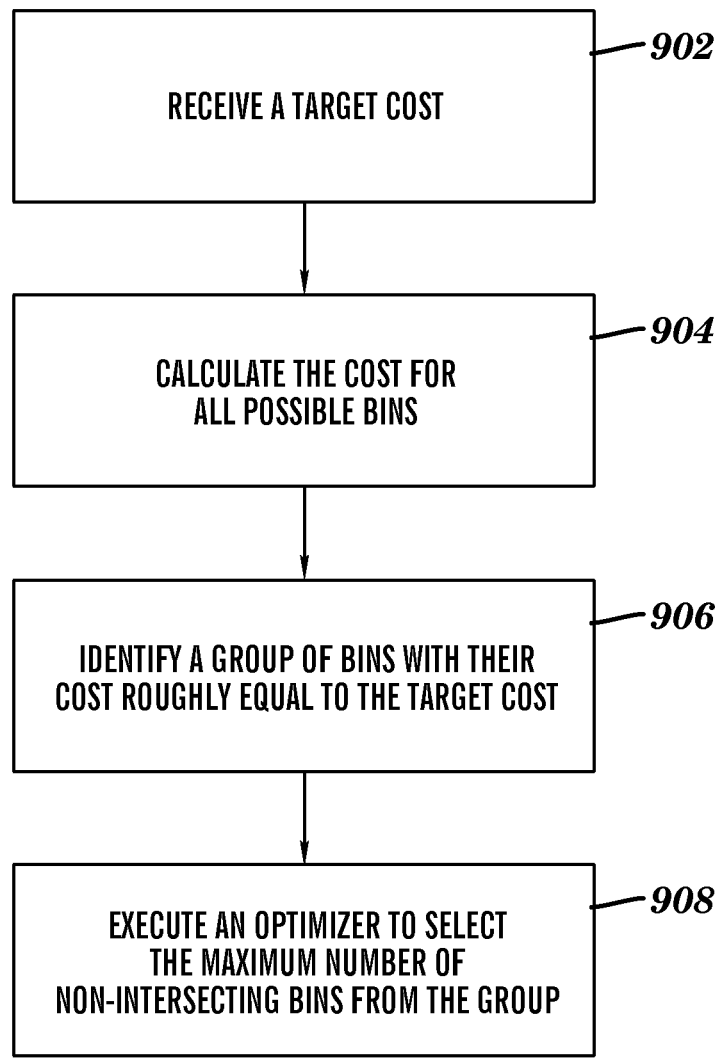
FIG. 9 illustrates a process flow for bin design that may be implemented by an exemplary embodiment.

FIG. 9 illustrates a process flow that may be implemented by an exemplary embodiment of the bin design logic 805 to select bin sizes and location to be stored in the storage 804. At block 902, the bin design logic 805 receives a target cost (e.g., a number of write iterations, a power usage) and desired guard band specifications. At block 904 all possible bins are identified along with an estimated cost associated with each identified bin. The actual cost associated with each bin can be determined by writing to the memory using each identified bin. Alternatively, the cost associated with each bin can be looked up based in a table or other storage location that stores cost information associated with bins (e.g., based on actual measurements and/or estimations). At block 906, a group of bins with a cost roughly equal to the target cost are identified. To implement this step, the algorithm employs a threshold and it determines that the group of bins have roughly equal costs if absolute value of the difference between the costs is less than the threshold. At block 908, an optimization algorithm is executed to select the maximum number of non-intersecting bins from the group, subject to the restrictions on the guard band specifications. One such specification might dictate at least a minimum separation between any two neighboring bins. Another specification might dictate that the separation between any two bins be a obtained by multiplying a specified parameter times the average of the sizes of the two bins in question. These non-intersecting bins represent the bin locations and sizes that are stored in storage 804 and that meet the target cost. The number of bins represents the number of different values that can be stored in the memory location for the target cost.

In an alternate exemplary embodiment, where a required number of bins is known, the target cost is decreased and steps 904 through 908 are executed until the number of bins is smaller than the required number of bins. The bin locations specified by the last iteration that produced the number of required bins are output from the bin design logic 805 as the bin locations stored in storage 804. Alternatively, the target cost may be increased if more bins are required. This results in getting the lowest possible cost while supporting the required number of bins. As described previously, the number of bins required is based on the number of different values (or levels) to be stored in each memory location. Also as described previously, the bin design logic 805 may insert a guard band between each of the bins to further separate the bins.

In an alternate exemplary embodiment, two different thresholds are used when creating the bins. In one embodiment, a first threshold is used to reserves a larger bin having a higher write cost than the other bins that is easy to program with a relatively small number of iterations as described herein below. The rest of the bins are designed so that they are all within a second cost threshold. Thus, if there are "n" bins in total, "n−1" of the bins are within the same cost threshold (the second threshold) and one bin is within a different cost threshold (the first threshold). In other words, the cost to write at least "n−1" of the bins is within a threshold (the second threshold) of the target cost.

Figure 10:
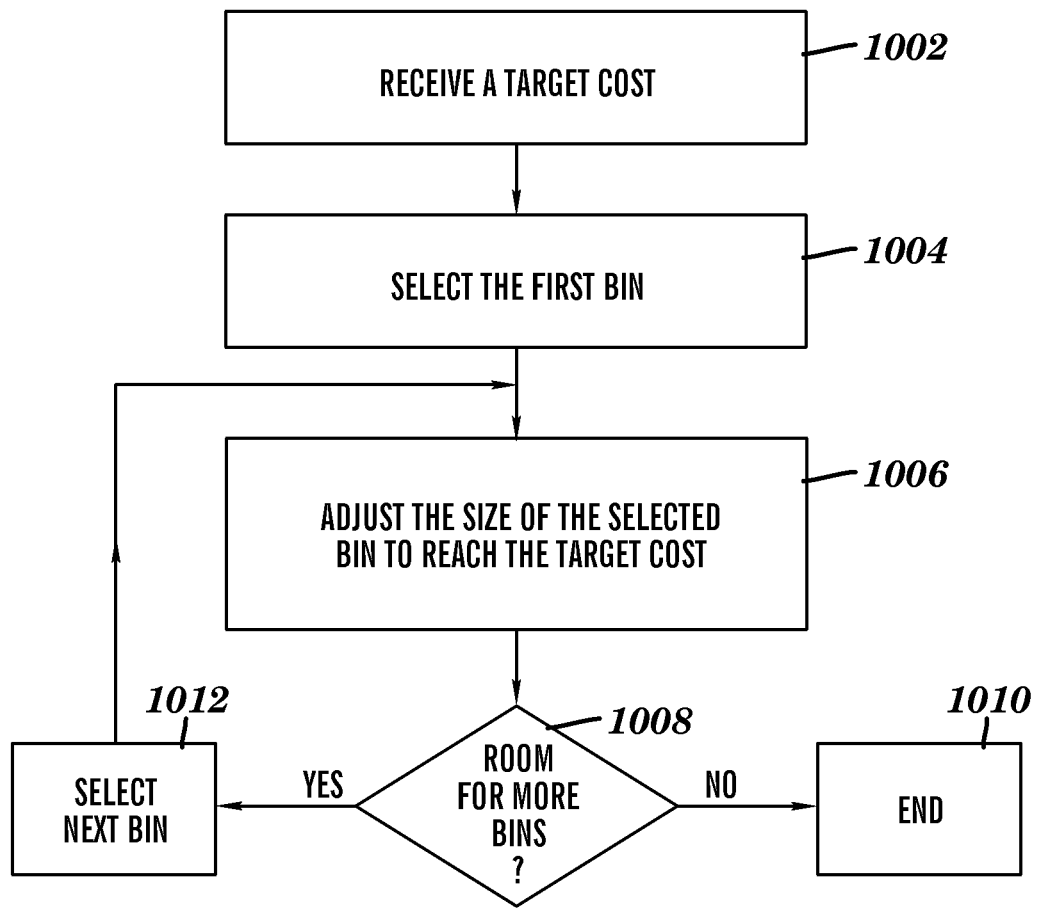
FIG. 10 illustrates a process flow for bin design that may be implemented by an exemplary embodiment.

FIG. 10 illustrates a process flow that may be implemented by an exemplary embodiment of the bin design logic 805 to select bin locations stored in storage 804. At block 1002, the bin design logic 805 receives a target cost and desired guard band specifications. At block 1004 the first bin is selected. In an exemplary embodiment, the first bin starts at the left border of the range of resistances that can be held by the memory location. In this embodiment, the left border of the first bin is the smallest possible output that may be read from the memory cell. At block 1006, the right border of the cell is chosen so that resulting bin has the smallest size possible with an associated cost as close to the target cost as possible; this in effect results on a selecting a different bin size but the same bin location. In an exemplary embodiment, block 1006 selects a bin size so that the resulting bin cost is as close as possible to the target cost but is less than the target cost. In an alternate exemplary embodiment, block 1006 selects the bin size so that the resulting bin cost is as close as possible to the target cost but is more than the target cost. At block 1008 it is determined if there is additional range available for more bins. If there is room for additional bins, then block 1012 is performed and the left border of the next bin is selected. In an exemplary embodiment, the left border of the next bin is the same as the right border of the previous bin. In an alternate exemplary embodiment, the right border of the next bin is selected to leave a space, or guard band, between the right border of the previous bin and the left border of the next bin. Processing then continues at blocks 1006 and 1008 until it is determined at block 1008 that the available range for bins has been consumed or no bin can be found with the target cost. When all possible bins at the target cost have been located, as determined at block 1008, processing ends at block 1010. The number of bins represents the number of different values (or levels) that can be stored in the memory location for the target cost.

In an alternate exemplary, if the number of required bins is known and is less than the number of bins that are possible for the target cost, the target cost is decreased and steps 1004 through 1010 are executed until the number of bins reaches the number of bins required. Alternatively, the target cost may be increased if more bins are required. This embodiment can be used to create the required number of bins at the lowest possible cost.

It is important to note that although the prescription that all bins (all "n" bins) have roughly equal cost is rooted on reasonable mathematical arguments of optimality of these kinds of configurations (as further explained below), it may very well be the case that after the execution of the bin design logic, it might be possible to add one more bin of cost less than the other bins, while being able to satisfy a guard band requirement. This could result in "n−1" of the bins being of roughly equal cost.

In addition, practical considerations might imply that up to one bin may be allowed to be an exception to this guideline of all bins having a roughly equal cost. One such consideration arises when it is required to design a system in which memory cells may be inherently defective and hence difficult to program. An example of such a setting is introduced by the notion of programming a memory cell to a pre-agreed bin when programming to any other bin appears to be difficult during the iterative programming algorithm. As used here, difficult might specifically mean a difficulty in reaching the desired bin within an allocated number of iterations. A cell that is programmed to the pre-agreed bin results conveys information during a read to the memory; this information includes the notion that such memory location does not contain actual user data; such information can be effectively be used during a read by an erasure error decoder to recover the missing data. A key requirement of the pre-agreed bin is that it must be very easy to program with preferably a single iteration or at least the fewest number of iterations possible even for defective memory cells, and hence have very low cost. Such pre-agreed bin has been identified in PCM with the resistance values around the RESET (amorphous) state.

The usage of the pre-agreed bin is expected to be relatively rare, so most writing takes place in the other bins. Therefore, it is a sensible decision to optimize separately the bins where most of the data communication takes place, subject to the requirement that a pre-agreed bin, not necessarily with substantially the same average cost than the other bins, be included in the bin collection. This can be accomplished easily by first selecting the pre-agreed bin, then removing from the range of possible values that a memory cell can take those values that the pre-agreed bin corresponds to, possibly with some additional values removed in the vicinity of the pre-agreed bin to account for a guard band specification. This results on a new set of (reduced) values that a cell is allowed to take on. The bin design logic is then executed with the new set of values as the allowed values for the cell, resulting in a set of bins that can then be augmented with the pre-agreed to bin to form the final collection of bins.

The following text describes an exemplary embodiment for the derivation of tight lower and upper bounds on the cost-constrained capacity of the simple re-write channel model described herein and illustrated, for example, in FIG. 3. In an exemplary embodiment, the noise width function is a restricted function whose domain is a finite union of adjacent intervals over which the function takes on constant values (referred to herein as "staircase functions").

For a simple re-write channel, such as the one depicted in FIG. 3, the cost constraint is determined by the channel law $P_{Y^i|X}$ for a single write operation, which is the same for every iteration i. The expected number of retries is given by:

$$E[L] = E\left[\frac{1}{P_{Y^i|X}(D|X)}\right] \quad (3)$$
$$= E\left[\frac{a(X)}{|\Delta|}\right]$$

where $\Delta \stackrel{\square}{=} D \cap [X-a(X)/2, X+a(X)/2]$ is a random variable that is determined by X and D, and $|\Delta|$ denotes the length of the interval $\Delta$. The range of the i-th output $Y^i$ extends beyond the range of the input X, which allows target bins beyond the range of X to be chosen. More generally, there is n requirement to specify an X which is contained in the target interval.

In an exemplary embodiment, in order to keep the average cost as low as possible, it is desirable to select the input X that maximizes the probability of falling into the interval $\Delta$. This is the motivation to define the following minimum noise width function:

$$a_{min}(y) = \inf\{a(x): y \in [x-a(x)/2, x+a(x)/2], x \in [0,1]\}.$$

Figure 11:
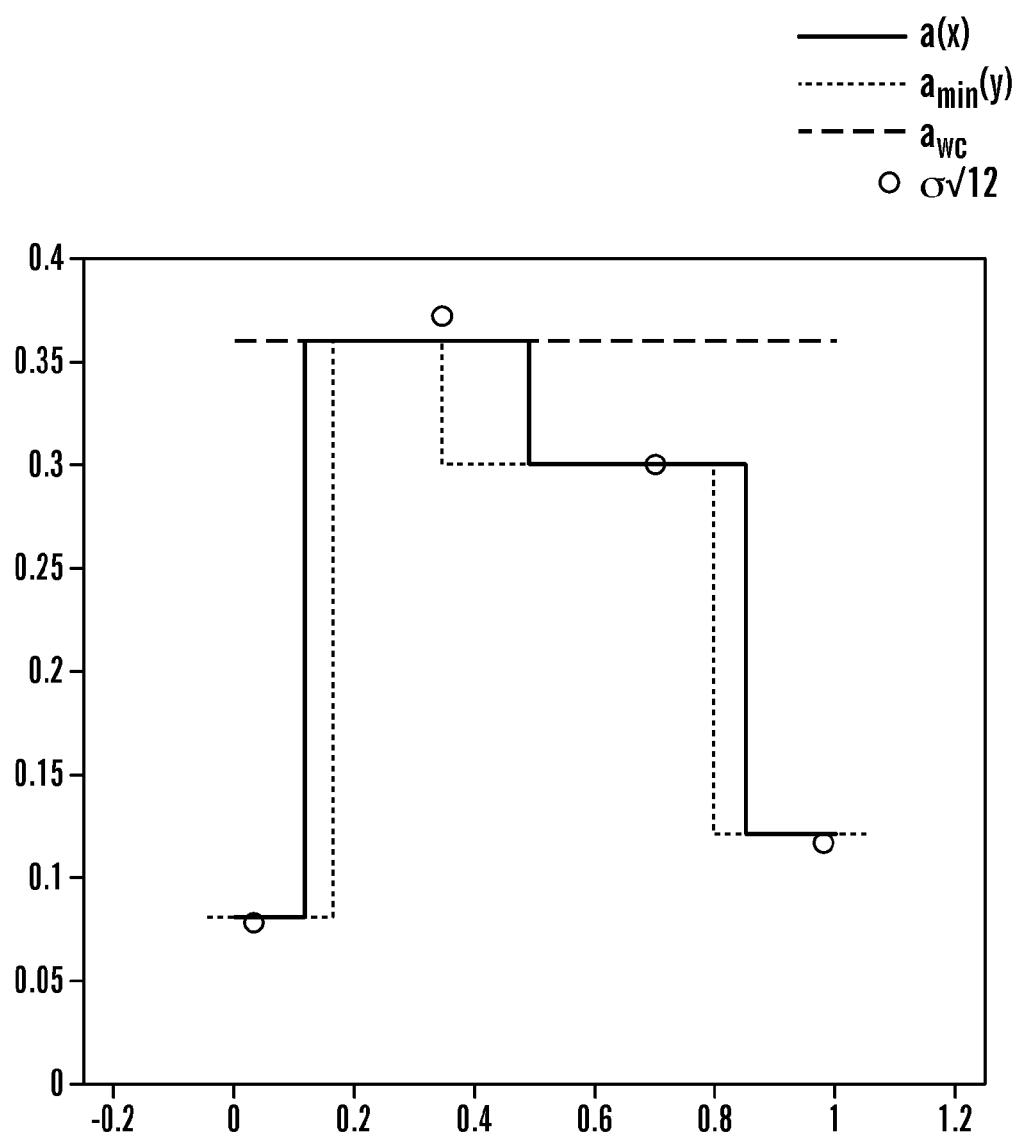
FIG. 11 illustrates an exemplary noise width function.

An example of a staircase noise width function a(x) and the corresponding minimum noise width function $a_{min}(y)$ is depicted in FIG. 11. In an exemplary embodiment, this function is chosen so that the standard deviation of the uniformly distributed noise matches that of the noise in FIG. 2, properly scaled and translated to fit into the range [0,1] (the standard deviation of a uniformly distributed noise of width a is a divided by the square root of twelve). FIG. 11 also shows the corresponding four data points of FIG. 2.

Each staircase noise width function is determined by a partition of the interval X=[0,1] into disjoint subintervals $[b_{n-1}, b_n)$ on which the function takes on constant values. Similarly, the minimum noise width function $a_{min}(Y)$ determines a partitioning of the range Y into $N_c$ disjoint subintervals $[c_{n-1}, c_n)$ n=1, ..., $N_c$, on which $a_{min}(\cdot)$ has constant value $\tilde{a}_n$ (it should be noted that the $a_{min}(\cdot)$ function may take on less values than the $a(\cdot)$).

Lower Bound Derivation. In an exemplary embodiment, a lower bound on the capacity of the cost-constrained rewritable channel is obtained by specifying a collection of pairs $\{(x_n, d_n)\}$ with non-overlapping bins $\{d_n\}$, which all satisfy the cost constraint. Since the intervals are non-overlapping, every cell stores a number of bits equal to the logarithm of the number M of target bins. The sequence of bins is defined as follows. Fix a cost $\kappa$, and for every interval $[c_{n-1}, c_n)$ (defining the discontinuities of the $a_{min}(y)$ function), allocate $M_n = \lfloor c_n - c_{n-1} \tilde{a}_n \kappa \rfloor$ adjacent non-overlapping bins, each of width $\tilde{a}_n/\kappa$ and characterized by average cost $\kappa$. Therefore, the total number of bins will be $M = \sum_{n=1}^{N_c} M_n$ at an average cost $\kappa$ (all average bin costs are equal). The capacity lower bound is therefore given by:

$$C_L = \log\left(\sum_{n=1}^{N_c} \left\lfloor \frac{c_n - c_{n-1}}{\tilde{a}_n} \kappa \right\rfloor\right).$$

Upper Bound Derivation. The following text describes an exemplary embodiment of finding an upper bound on storage capacity. To obtain an upper bound on the capacity, it is assumed that the sequence of random variables $(X,D) \to \Delta \to Y$ is a Markov chain. This holds because $p(y|x,d) = P(y|\delta)$, which is clear from the following equation:

$$p(y|x,d) = \begin{cases} \frac{1}{|\delta|} & \text{if } y \in \delta = d \cap \left[x - \frac{a(x)}{2}, x + \frac{a(x)}{2}\right] \\ 0 & \text{otherwise} \end{cases} \quad (4)$$

Furthermore, since $\Delta$ is a deterministic function of X and D, it follows that the mutual information terms I(X,D;Y) and I($\Delta$;Y) are equal.

Given the cost constraint $E[L] \leq \kappa$, an upper bound for $I(X,D;Y) = I(\Delta;Y) = h(Y) - h(Y|\Delta)$ is obtained by finding an upper bound for h(Y) and a lower bound for h(Y|$\Delta$).

Lemma 1. Let Y and A be a real valued and a discrete random variable, respectively, being A the sample space of A which is assumed to be finite. It is assumed that the differential entropy h(Y|A) exists and is finite. Then $$h(Y) \leq \sum_{a \in A} P_A(a) \log \int_Y P_{A|Y}(a|y) dy + H(A).$$

Proof. Denote probabilities with P(•) and densities with P(•). The proof is as follows:

$$h(Y) = H(A) + h(Y|A) - H(A|Y) \quad (5)$$

$$= H(A) + \sum_{a \in A} P_A(a) E[-\log p_{Y|A}(Y|A) | A = a] -$$

$$\sum_{a \in A} P_A(a) E[-\log P_{A|Y}(A|Y) | A = a]$$

$$= H(A) + \sum_{a \in A} P_A(a) E\left[\log \frac{P_{A|Y}(A|Y)}{p_{Y|A}(Y|A)} \bigg| A = a\right]$$

$$\leq H(A) + \sum_{a \in A} P_A(a) \log E\left[\frac{p_{A|Y}(A|Y)}{p_{Y|A}(Y|A)} \bigg| A = a\right]$$

$$= H(A) + \sum_{a \in A} P_A(a) \log \int_Y P_{A|Y}(a|y) dy$$

where the inequality follows from Jensen's inequality and using the fact that $$E\left[\frac{P_{A|Y}(A|Y)}{p_{Y|A}(Y|A)} \bigg| A = a\right] = \int_Y P_{A|Y}(a|y) dy.$$

Define $A = a(X)$. Since the data dependent noise function $a(\cdot)$ is a staircase function, A takes value on the discrete set $A = \{a_1, \ldots, a_{N_a}\}$. Define $p_n = P_A(a_n)$ Lemma 2. Let A, Y, D, X, $\Delta$, and L be defined as above. Then, $$\text{i. } h(Y) \leq \sum_{n=1}^{N_a} p_n \log \frac{\int_Y P_{A|Y}(a_n|y) dy}{p_n} \quad (i)$$

$$\text{ii. } h(Y|\Delta) \geq -\sum_{n=1}^{N_a} p_n \log(\kappa/a_n) \quad (ii)$$

Proof. (i) follows directly from Lemma 1. In order to prove (ii) note that, based on equation (4), given $\Delta$, Y is uniformly distributed over $\Delta$. Then, it can be written that $$h(Y|\Delta) = -E[\log(1/|\Delta|)] = -\sum_{n=1}^{N_a} p_n E[\log(1/|\Delta|) | A = a_n].$$

By applying Jensen's inequality, the right side can be lower bounded and one obtains the first inequality below:

$$h(Y|\Delta) \geq -\sum_{n=1}^{N_a} p_n \log\left(E\left[\frac{1}{|\Delta|} \bigg| A = a_n\right]\right) \quad (5)$$

$$= -\sum_{n=1}^{N_a} p_n \log\left(\frac{1}{a_n} E\left[\frac{A}{|\Delta|} \bigg| A = a_n\right]\right)$$

$$= -\sum_{n=1}^{N_a} p_n \log E\left[\frac{A}{|\Delta|} \bigg| A = a_n\right] + \sum_{n=1}^{N_a} p_n \log a_n$$

$$\geq -\log E\left[\frac{A}{|\Delta|}\right] + \sum_{n=1}^{N_a} p_n \log a_n$$

$$= -\log E\left[\frac{a(X)}{|\Delta|}\right] + \sum_{n=1}^{N_a} p_n \log a_n$$

$$\geq -\log \kappa + \sum_{n=1}^{N_a} p_n \log a_n \quad (6)$$

$$= -\sum_{n=1}^{N_a} p_n \log(\kappa/a_n)$$

where equation (5) follows by Jensen's inequality and equation (6) holds by the hypothesis $E[L] \leq \kappa$ and by equation (3).

Theorem 1. The upper bound on capacity of the simple rewritable channel with cost constraint $E[L] \leq \kappa$ is given by:

$$C_U = \log\left(\int_Y \frac{\kappa}{a_{min}(y)} dy\right) \quad (7)$$

Proof. Using the above lemma, the mutual information $I(X,D;Y) = I(\Delta;Y) = h(Y) - h(Y|\Delta)$ can be bounded by:

$$h(Y) - h(Y|\Delta) \leq \sum_{n=1}^{N_a} p_n \log \frac{\kappa \int_Y P_{A|Y}(a_n|y) dy}{p_n a_n}$$

$$\leq \log\left(\kappa \sum_{n=1}^{N_a} \frac{\int_Y P_{A|Y}(a_n|y) dy}{a_n}\right)$$

where the last inequality is based on the log-sum inequality. The proof will be completed by showing:

$$\sum_{n=1}^{N_a} \frac{\int_Y P_{A|Y}(a_n|y) dy}{a_n} \leq \int_Y \frac{1}{a_{min}(y)} dy. \quad (8)$$

The left side can be rewritten as:

$$\text{i. } dd \sum_{n=1}^{N_a} \frac{\int_Y P_{A|Y}(a_n|y) dy}{a_n} = \int_Y \sum_{n=1}^{N_a} \frac{P_{A|Y}(a_n|y)}{a_n} dy.$$

Inequality (8) will follow if for each $y \in Y$ $$\sum_{n=1}^{N_a} \frac{P_{A|Y}(a_n|y)}{a_n} \leq \frac{1}{a_{min}(y)}.$$

Note that by the definition of $a_{min}(\bullet)$, one has $\min\{a_n:P_{A|Y}(a_n|y)>0\} \leq a_{min}(y)$ and, thus, $$\sum_{n=1}^{N_a} \frac{P_{A|Y}(a_n|y)}{a_n} \leq \frac{\sum_{n=1}^{N_a} P_{A|Y}(a_n|y)}{a_{min}(y)} = \frac{1}{a_{min}(y)}.$$

In an exemplary embodiment, for a data-independent uniform noise distribution, the upper bound reduces to $C_U = \log(\kappa(1+a)/a)$.

Figure 12:
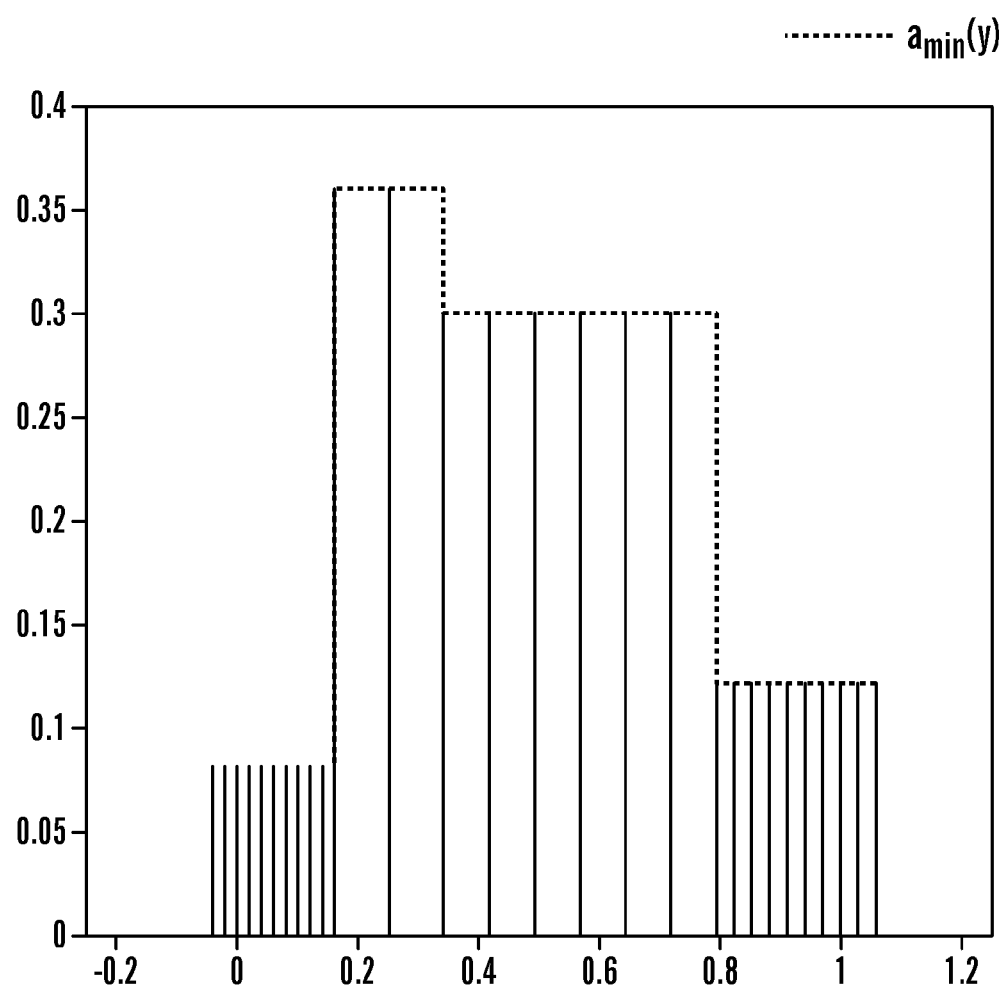
FIG. 12 illustrates an exemplary capacity achieving bin distribution for a target cost constraint.

In an exemplary embodiment, the upper bound and the lower bound are tight, i.e., $C_U = C_L$, whenever $(c_n - c_{n-1})\kappa/a_n$ is an integer for all $n = 1, \ldots, N_c$. For a cost of $\kappa = 2$, a capacity-achieving distribution with $5+1+3+4=13$ bins for the example noise in FIG. 11, is illustrated in FIG. 12. The corresponding capacity is $\log(13) = 3.7004$ bits.

Even though $a(\bullet)$ might be arbitrarily large, the upper bound in equation (7) cannot take on negative values, even at the minimum cost $\kappa = 1$ (the minimum number of write attempts is one). The integral cannot be made arbitrarily small since the support set of Y is a function of $a(\bullet)$. In particular, the support interval length is always larger than $\max_x a(x)$. As a consequence, $$\int_Y \frac{1}{a_{min}(y)} dy \geq \frac{|Y|}{\max_y a_{min}(y)} \geq \frac{\max_x a(x)}{\max_y a_{min}(y)} \geq 1.$$

Bound for general noise data dependency. In an exemplary embodiment, the capacity bounds for the simple cost-constrained rewritable channel model is extended from staircase to more general noise width functions. For the upper bound, the limiting process of the definite Riemann integral may be applied by approximating any Riemann integrable function, by staircase functions. Thus, the upper bound $C_U$ of Theorem 1 extends to Riemann integrable noise width functions and has the same formal expression as equation (7).

For the lower bound on capacity, for a cost $\kappa$, a partitioning of the range of Y into disjoint subintervals can be chosen with boundaries $\{c_n\}$, $n=0, \ldots, N_c$, such that the target bins have minimal size subject to the constraints $\Box(c_n - c_{n-1})\kappa/a_n\Box = 1$, where $a_n = \max\{a_{min}(y): c_{n-1} \leq y < c_n\}$. This condition implies that each subinterval corresponds to one target bin, i.e., $M_n = 1$ and $\Sigma_{n=1}^{N_c} M_n = N_c$. Depending on the way the boundaries are selected, different target bin collections can result. To get a good lower bound, a selection with the largest number $N_c$ of bins is chosen. The capacity is lower bounded by $C_L = \log(N_c)$.

Figure 13:
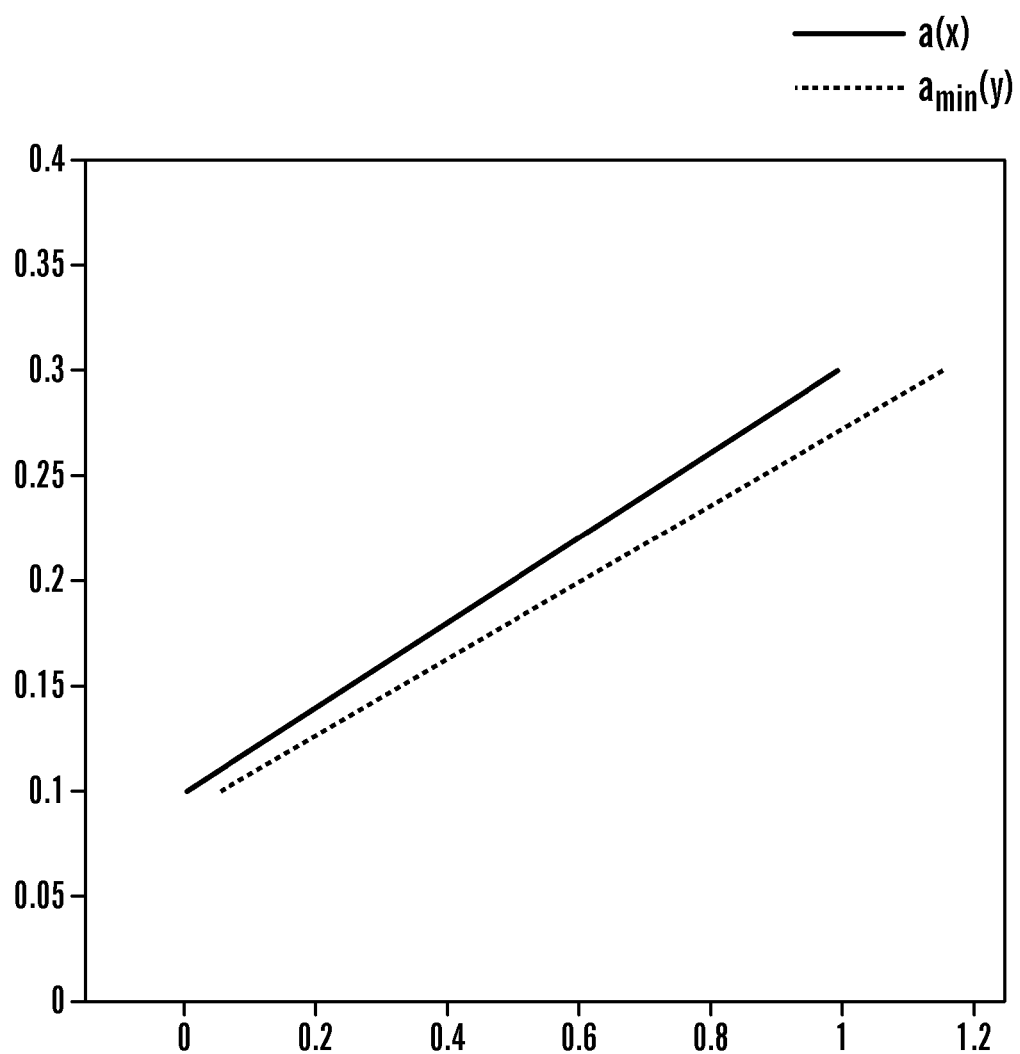
FIG. 13 illustrates an exemplary continuous data dependent noise width function.

Numerical results. For the rewritable channel with data-dependent noise $a(x)$ shown in FIG. 11, the capacity upper and lower bounds $C_U$ and $C_L$ are plotted as a function of $\kappa$ in FIG. 13. In addition, the capacity lower bound obtained using a uniform bin subdivision is also shown. Note that, in this case, the information storage using the uniform subdivision is about 0.8 bits lower than the upper bound for the data-dependent case. Thus, in this example there is about a 0.8 bit penalty if one neglects the data-dependent nature of the noise and simply considers a rewrite scheme that is based on uniform noise.

Figure 14:
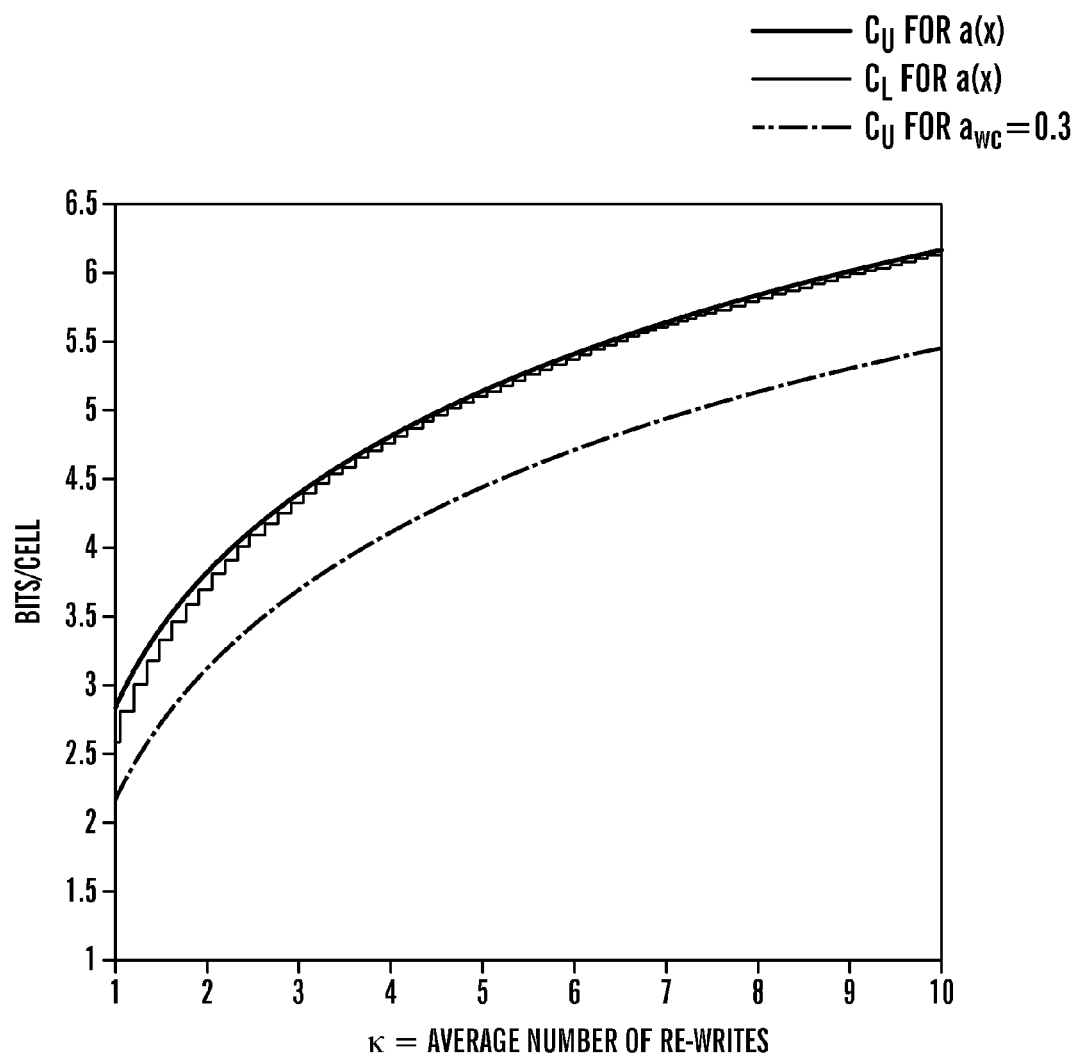
FIG. 14 illustrates exemplary capacity bounds for the continuous noise width function of FIG. 13.
Figure 15:
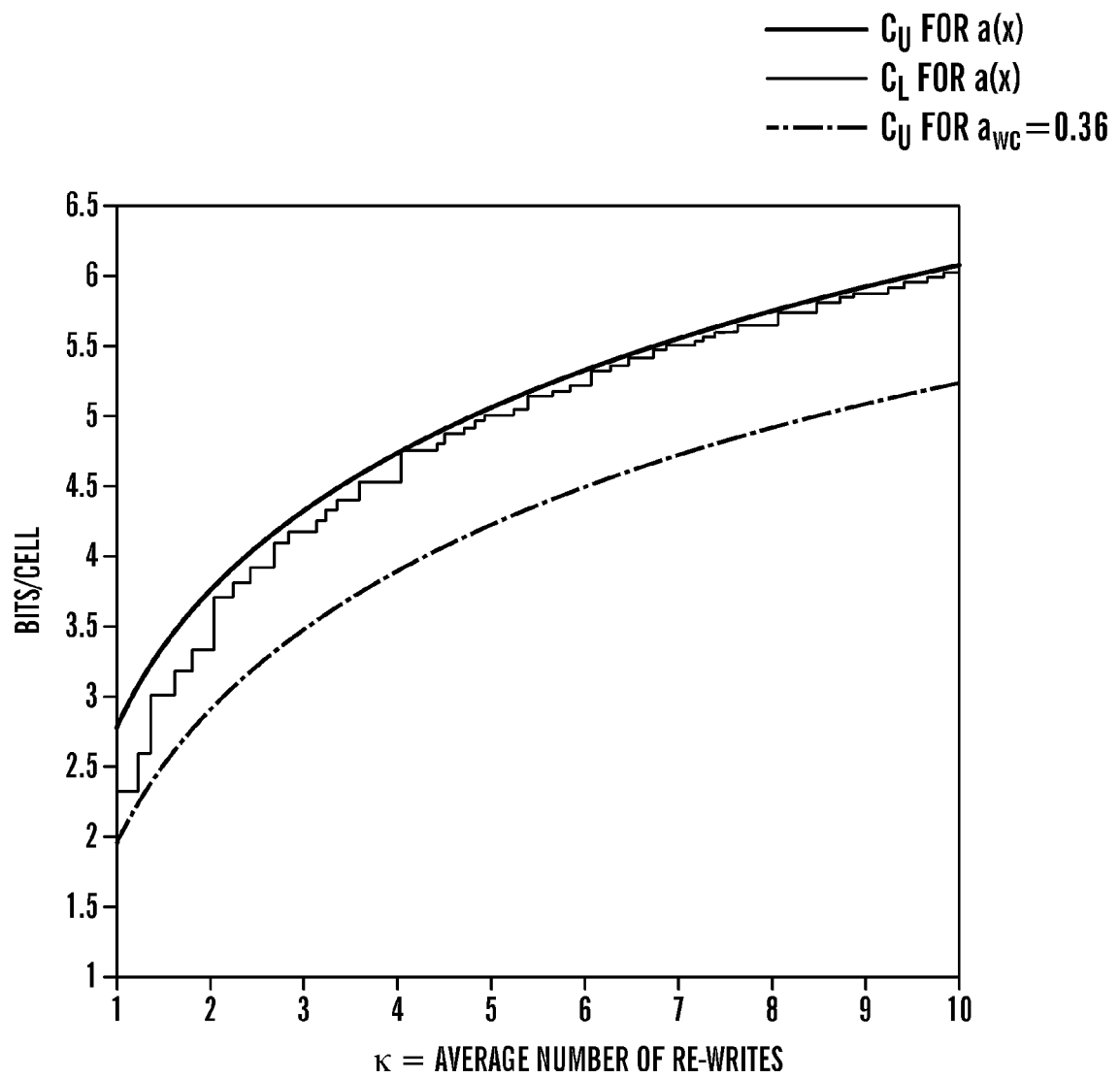
FIG. 15 illustrates exemplary capacity bounds for the noise width function of FIG. 11.

FIG. 14 shows an example of a continuous noise width function $a(x)$. The corresponding upper and lower capacity bounds are plotted in FIG. 15. As a comparison, the information storage obtained using a uniform bin subdivision, optimal in the case of non data-dependent noise, is also shown.

Figure 16:
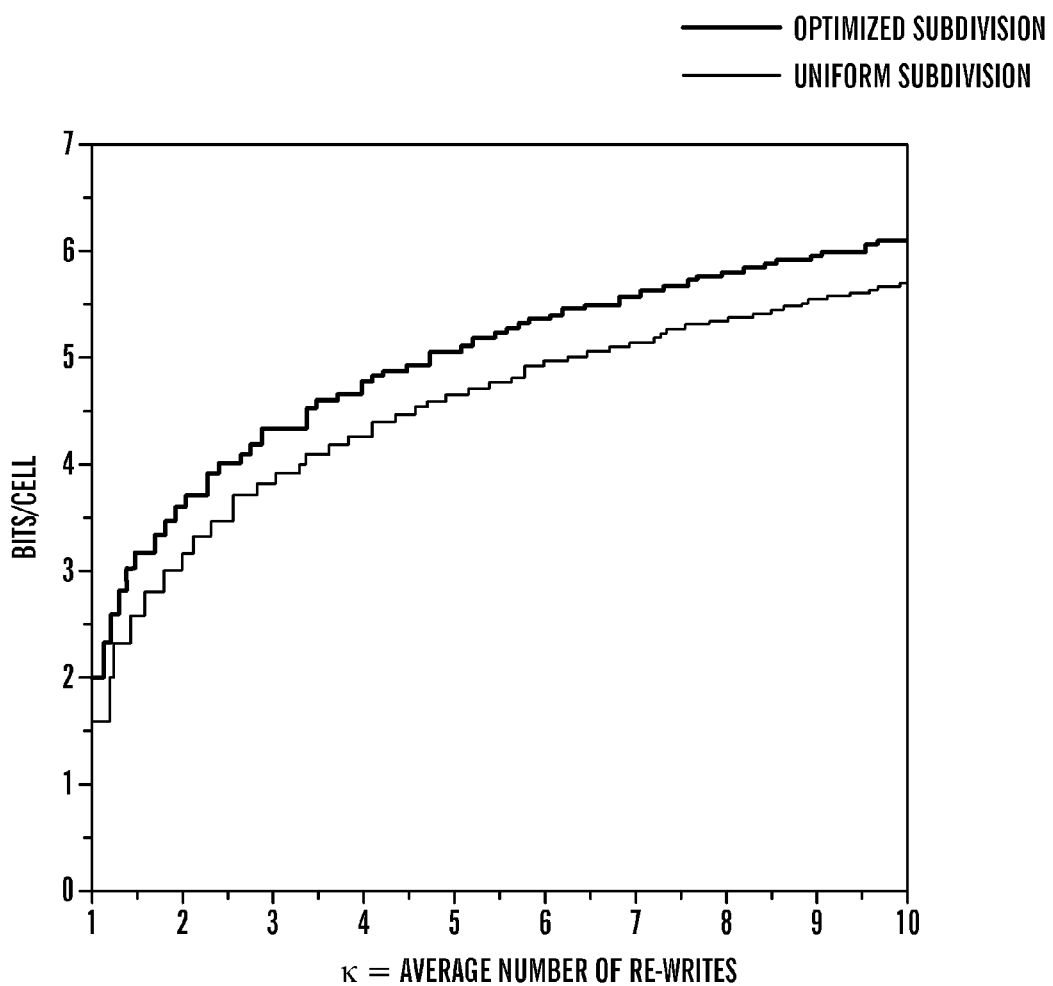
FIG. 16 illustrates exemplary capacity lower bounds for a Gaussian rewritable channel.

By substituting the uniformly distributed noise $W^i$ in equation (2) with a unit variance white Gaussian noise $N^i$, the following rewritable channel model is obtained: $Y^i = X^i + a(X^i)\sqrt{12}N^i$. This is a Gaussian rewritable channel with data dependent noise. The $\sqrt{12}$ term makes the noise variance as a function of $X^i$ equal in both Gaussian and uniformly distributed noise, whenever the $a(X)$ functions coincide. It is possible to compute lower bounds on the capacity of the Gaussian rewritable channel by fixing the write policy to have non-overlapping bins and numerically computing the average cost. In FIG. 16, lower bounds on the cost constrained capacity of a Gaussian rewritable channel with data dependent noise are shown. The noise width function $a(X)$ is as in FIG. 11. Two different bin configurations are considered: a uniform subdivision, and the subdivision suggested by the lower bound for the uniformly distributed noise channel. Although the use of an input distribution derived for the uniformly distributed case is suboptimal, it is associated with a storage increase of about 0.4 bits/cell with respect to that obtained with uniform subdivision of the [0,1] interval.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list)

of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer implemented method for selecting bins in a memory, the method comprising:
    receiving, at a computer, a target cost for performing writes at an analog memory, the analog memory capable of storing a range of values;
    determining, at the computer, one or more possible bins that may be created in the range of values and a cost associated with each of the one or more possible bins, each of the one or more possible bins including one or more of the values;
    identifying, at the computer, a group of bins in the one or more possible bins with associated costs that are within a threshold of the target cost;
    selecting, at the computer, a maximum number of bins having non-overlapping values from the group of bins; and
    storing, at the computer, the selected bins, the values of the selected bins utilized to encode and decode contents of the analog memory.

2. The method of claim 1, further comprising identifying a first bin in the one or more possible bins that has an associated cost that is not within the threshold of the target cost, wherein the first bin is one of the selected bins.

3. The method of claim 1, wherein the analog memory is phase change memory (PCM) and the range of values are resistance values.

4. The method of claim 1, wherein the target cost is a number of iterations required to perform a write.

5. The method of claim 1, wherein the target cost is an amount of power required to perform a write.

6. The method of claim 1, wherein the target cost is a lowest cost associated with a target number of bins.

7. The method of claim 1, wherein the selected bins are separated by a guard band.

8. A computer implemented method for selecting bins in a memory, the method comprising:
    receiving at a computer a target cost for performing writes at an analog memory, the analog memory capable of storing a range of values, the range of values ordered starting with a first value;
    selecting a first bin having a first boundary equal to the first value;

selecting a second boundary for the first bin such that the second boundary includes a number of consecutive values starting with the first value and a cost for performing a write to the first bin is within a first threshold of the target cost;

selecting subsequent bins having non-overlapping values until the cost for performing a write to a subsequent bin is not within a second threshold of the target cost and there are no more values left within the range of values; and storing the first bin and the subsequent bins as selected bins, the values of the stored bins utilized to encode and decode contents of the analog memory.

9. The method of claim 8, wherein the first threshold of the target cost is equal to the second threshold of the target cost.

10. The method of claim 8, wherein the analog memory is phase change memory (PCM) and the range of values are resistance values.

11. The method of claim 8, wherein the target cost is one or more of a number of iterations required to perform a write and an amount of power required to perform a write.

12. The method of claim 8, wherein the target cost is a lowest cost associated with a target number of bins.

13. The method of claim 8, wherein the selected bins are separated by a guard band.

\* \* \* \* \*